US009735062B1

(12) United States Patent
Doris et al.

(10) Patent No.: US 9,735,062 B1
(45) Date of Patent: Aug. 15, 2017

(54) DEFECT REDUCTION IN CHANNEL SILICON GERMANIUM ON PATTERNED SILICON

(71) Applicant: International Business Machines Corporation, Armonk, NY (US)

(72) Inventors: Bruce B. Doris, Slingerlands, NY (US); Nicolas J. Loubet, Guilderland, NY (US); Alexander Reznicek, Troy, NY (US); Joshua M. Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/172,472

(22) Filed: Jun. 3, 2016

(51) Int. Cl.
H01L 21/84 (2006.01)
H01L 21/8238 (2006.01)
H01L 27/092 (2006.01)
H01L 29/161 (2006.01)
H01L 21/02 (2006.01)
H01L 27/12 (2006.01)
H01L 21/3065 (2006.01)

(52) U.S. Cl.
CPC .. *H01L 21/823807* (2013.01); *H01L 21/0262* (2013.01); *H01L 21/02238* (2013.01); *H01L 21/02255* (2013.01); *H01L 21/02532* (2013.01); *H01L 21/02642* (2013.01); *H01L 21/3065* (2013.01); *H01L 21/84* (2013.01); *H01L 27/092* (2013.01); *H01L 27/1203* (2013.01); *H01L 29/161* (2013.01)

(58) Field of Classification Search
None
See application file for complete search history.

(56) References Cited

U.S. PATENT DOCUMENTS

| | | | |
|---|---|---|---|
| 7,387,925 B2 | 6/2008 | Shang et al. | |
| 7,427,556 B2 | 9/2008 | Tomasini et al. | |
| 7,790,538 B2 | 9/2010 | Shang et al. | |
| 9,040,373 B2 | 5/2015 | Chidambarrao et al. | |
| 2004/0119125 A1* | 6/2004 | Gogoi | B81C 1/00476 257/414 |
| 2004/0259333 A1 | 12/2004 | Tomasini et al. | |
| 2005/0133817 A1* | 6/2005 | Huang | H01L 21/28518 257/192 |
| 2007/0042572 A1* | 2/2007 | Bauer | H01L 21/02381 438/478 |
| 2008/0248616 A1 | 10/2008 | Shang et al. | |
| 2014/0252483 A1* | 9/2014 | Nagumo | H01L 21/845 257/351 |
| 2014/0353760 A1 | 12/2014 | Loubet et al. | |

* cited by examiner

*Primary Examiner* — Charles Garber
*Assistant Examiner* — Alia Sabur
(74) *Attorney, Agent, or Firm* — Scully, Scott, Murphy & Presser, P.C.; Daniel P. Morris

(57) ABSTRACT

After forming a blanket silicon germanium (SiGe) layer over a thinned silicon (Si) layer of a silicon-on-insulator (SOI) substrate, a portion of the SiGe layer located in an n-type FET (nFET) region of the SOI substrate is recessed, while masking another portion of the SiGe layer located in a p-type FET (pFET) region of the SOI substrate. The recessed portion of the SiGe layer in the nFET region is subsequently removed with an in-situ pre-clean etch. An epitaxial Si layer is re-grown in the nFET region over a portion of the thinned Si layer that is exposed by the removal of the recessed portion of the SiGe layer.

20 Claims, 6 Drawing Sheets

DEFECT REDUCTION IN CHANNEL SILICON GERMANIUM ON PATTERNED SILICON

BACKGROUND

The present disclosure relates to semiconductor device fabrication, and more particularly to a method of forming a silicon germanium channel on patterned silicon for use in hybrid channel complementary metal oxide semiconductor (CMOS) transistors.

As CMOS transistors scale down, methods of improving circuit performance are increasingly important. For certain technology node device requirements, it is necessary to use different channel materials for p-type FETs (pFETs) and n-type FETs (nFETs). For example, by taking advantage of high hole mobility of silicon germanium (SiGe) and high electron mobility of silicon (Si), performance of hybrid channel CMOS transistors with SiGe as the p-channel material and Si as the n-channel material can be greatly enhanced.

FIGS. 1 and 2 illustrate a conventional method for integrating SiGe and Si channel materials on a common substrate. As shown in FIG. 1, a silicon-on-insulator (SOI) substrate 100 having a top silicon layer 110 is first provided. A portion of the top silicon layer 110 located in a pFET region of the SOI substrate 110 is recessed by an anisotropic etch such as, for example, a timed reactive ion etch (RIE), while covering another portion of the top silicon layer 110 located in an nFET region of the SOI substrate 100 by a mask 120. Thereafter and as shown in FIG. 2, a pre-clean is carrier out prior to the epitaxial growth of SiGe to remove any native oxide from the recessed portion of the top silicon layer 110. A SiGe forming process is then performed to form a SiGe channel layer 130 over the recessed portion of the top silicon layer 110. The SiGe forming process may include a pre-bake clean process and a SiGe epitaxial grown process. The pre-bake clean process is typically performed at a relatively high temperature of about 800° C.

However, several problems are associated with the above described prior art integration process. First, since the RIE process is very sensitive to errors in the fabrication process, using RIE normally results in different Si recess depths at different locations in the pFET region. The recessed portion of the top Si layer 110 and the SiGe channel layer 130 subsequently formed thereon are not uniform due to the non-uniform recess. As a result, device characteristics vary as a function of device width, adversely increasing device design complication. In addition, recessed portion of the top Si layer 110 that remains in the pFET region is rather thin (e.g., the thickness of the recessed portion of the top Si layer 110 is typically less than 10 nm), the high pre-bake temperature can cause unwanted Si reflow, which results in corner rounding of the SiGe channel layer 130. The corner rounding often induces defects formation in the SiGe channel layer 130. Therefore, a method of forming a SiGe channel layer with improved uniformity and reduced defects for hybrid channel CMOS transistors remains needed.

BRIEF SUMMARY

The present application provides a method of forming a SiGe channel layer with improved uniformity and reduced defects for hybrid channel CMOS transistors. After forming a blanket SiGe layer over a thinned Si layer of a SOI substrate, a portion of the SiGe layer located in an nFET region of the SOI substrate is recessed while masking another portion of the SiGe layer located in a pFET region of the SOI substrate. The recessed portion of the SiGe layer in the nFET region is subsequently removed with an in-situ pre-clean etch. An epitaxial Si layer is re-grown in the nFET region over a portion of the thinned Si layer that is exposed by the removal of the recessed portion of the SiGe layer.

According to an aspect of the present application, a method of forming a semiconductor structure is provided. The method includes first forming a SiGe layer over a thinned Si layer located over a substrate. A portion of the SiGe layer located in a first device region of the substrate is recessed while masking another portion of the SiGe layer located in a second device region of the substrate. After removing the recessed portion of the silicon germanium layer to expose a portion of the thinned silicon layer in the first device region, an epitaxial Si layer is formed over the exposed portion of the thinned Si layer in the first device region.

DETAILED DESCRIPTION

Figure 1:
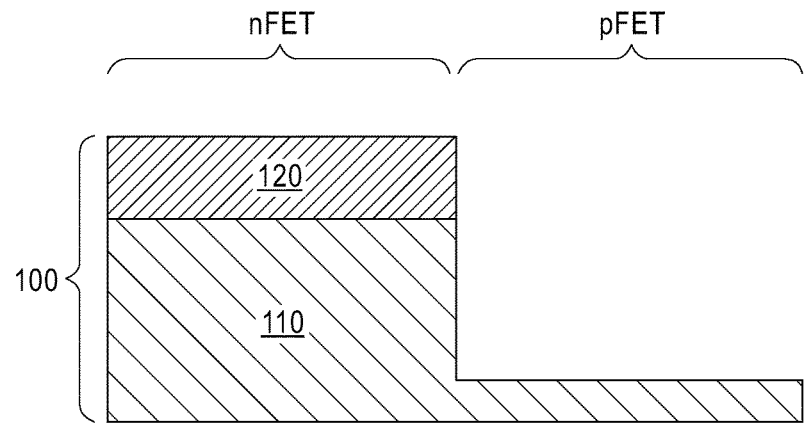
FIG. 1 is a cross-sectional view of a prior art semiconductor structure after recessing a portion of a top Si layer in a silicon-on-insulator (SOI) substrate located in a pFET region.
Figure 2:
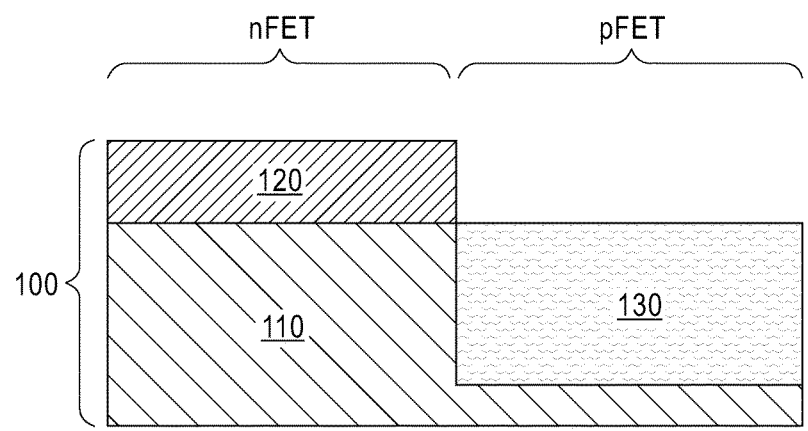
FIG. 2 is a cross-sectional view of the prior art semiconductor structure of FIG. 1 after forming a SiGe channel layer over a recessed portion of the top Si layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 3:
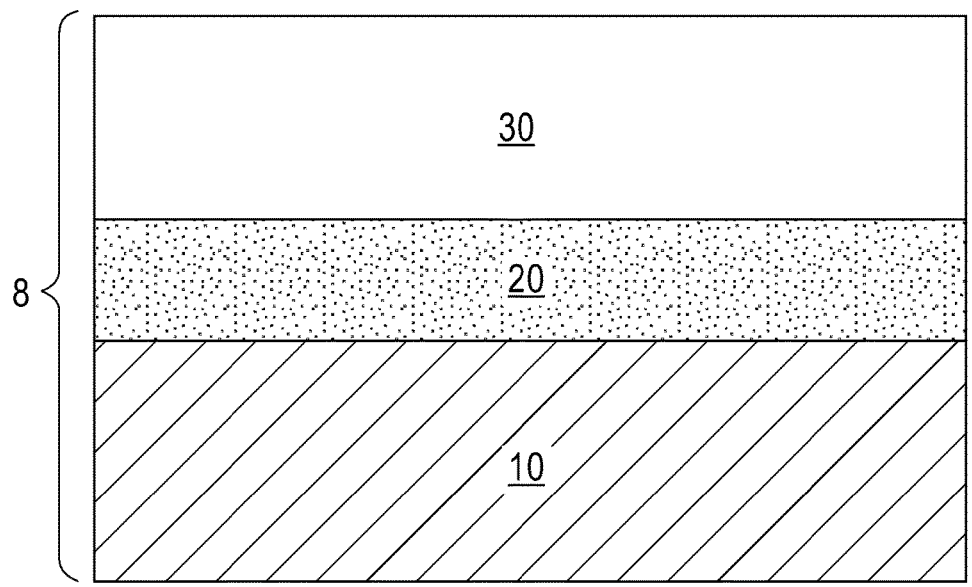
FIG. 3 is a cross-sectional view of an exemplary semiconductor structure including a SOI substrate composed of a handle substrate, a buried insulator layer and a top Si layer according to an embodiment of the present application.

Referring to FIG. 3, an exemplary semiconductor structure that can be employed according to an embodiment of the present application includes a SOI substrate 8. The SOI substrate 8 includes, from bottom to top, a handle substrate 10, a buried insulator layer 20 and a top Si layer 30. In some embodiments, the handle substrate 10 can be omitted.

The handle substrate 10 may include a semiconductor material such as, for example, Si, SiGe, silicon germanium carbide (SiGeC), silicon carbide (SiC), an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline Si. The thickness of the handle substrate 10 can be from 50 μm to 2 mm, although lesser and greater thicknesses can also be employed.

The buried insulator layer 20 that is located over the handle substrate 10 may include a dielectric material such as silicon dioxide, silicon nitride, silicon oxynitride, boron nitride, or a combination thereof. In one embodiment, the buried insulator layer 20 may be formed by a deposition process, such as chemical vapor deposition (CVD), plasma enhanced chemical vapor deposition (PECVD) or physical vapor deposition (PVD). Alternatively, the buried insulator layer 20 may be formed by thermal nitridation and/or thermal oxidation of a surface portion of the handle substrate 10. The buried insulator layer 20 can also be formed by implanting oxygen atoms into a bulk semiconductor substrate and thereafter annealing the structure. The thickness of the buried insulator layer 20 can be from 50 nm to 200 nm, although lesser and greater thicknesses can also be employed.

The top Si layer 30 that is located over the buried insulator layer 20 may include single crystalline Si. The top Si layer 30 can represent an uppermost portion of a bulk silicon substrate in which oxygen atoms used to form the buried insulating layer 20 are implanted therein. Alternatively, the top Si 30 may initially be formed on a handle wafer (not shown) and then bonded to the buried insulator layer 20. The top Si layer 30 may have a thickness from 100 nm to 1 μm, although lesser or greater thicknesses can also be employed.

Figure 4:
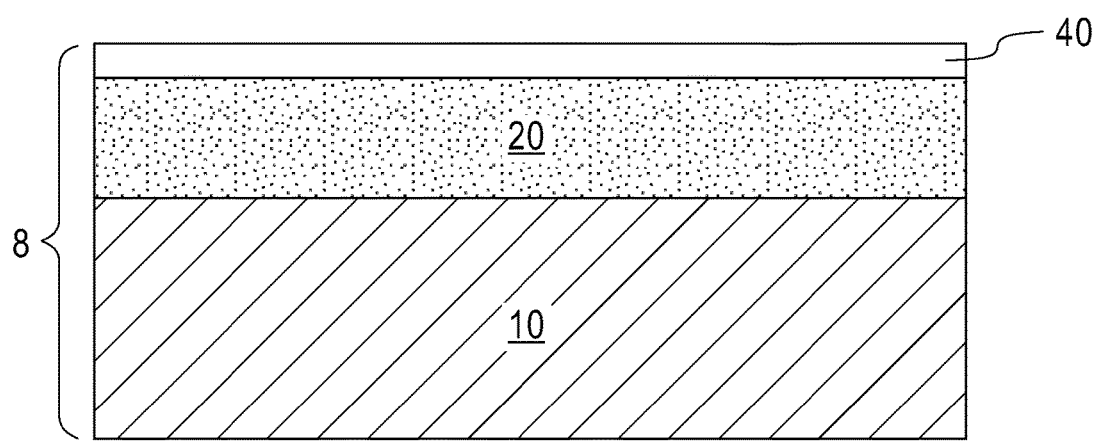
FIG. 4 is a cross-sectional view of the exemplary semiconductor structure of FIG. 3 after thinning the top Si layer to provide a thinned Si layer.

Referring to FIG. 4, the top Si layer 30 is thinned to provide a thinned Si layer 40. In one embodiment, the top Si layer 30 can be thinned using oxidation and etching techniques. The thinning of the top Si layer 30 includes oxidizing silicon by an oxidation process such that the top Si layer 30 is partially oxidized to form an oxidized portion (not shown) in an upper portion of the top Si layer 30. In one embodiment, the oxidized portion includes silicon dioxide. The top Si layer 30 may be partially oxidized by any suitable method. In some embodiments, the top Si layer 30 may be partially oxidized by reacting with oxygen from the atmosphere surrounding the SOI substrate 8 to form the oxidized portion. In some embodiments, the top Si layer 30 may be partially oxidized using a thermal oxidation method to form the oxidized portion. For example, the partial oxidation of the top Si layer 30 may be performed using water vapor and/or molecular oxygen as oxidants.

The oxidized portion of the top Si layer 30 is then removed by, for example, a wet etch. In one embodiment, an etchant solution such as dilute HF may be used to remove the oxidized portion of the SOI layer 30. The oxidation and etching processes can be repeated until a desired thickness is achieved. The remaining portion of the top Si layer 30 constitutes the thinned Si layer 40. The thinned Si layer 40 may have a thickness of 10 nm or less. In one embodiment, the thickness of the thinned Si layer 40 is 10 nm.

In the present application, since the top Si layer 30 is uniformly oxidized across the entire SOI substrate 8 and the subsequent wet etch only removes the oxidized portion, the thinned Si layer 40 thus formed can have improved uniformity and reduced surface roughness compared to the recessed portion of the top Si layer 110 formed by the RIE process in the prior art method. The improved uniformity of the thinned Si layer 40 ensures uniformity of subsequently deposited SiGe layer and Si layer.

Figure 5:
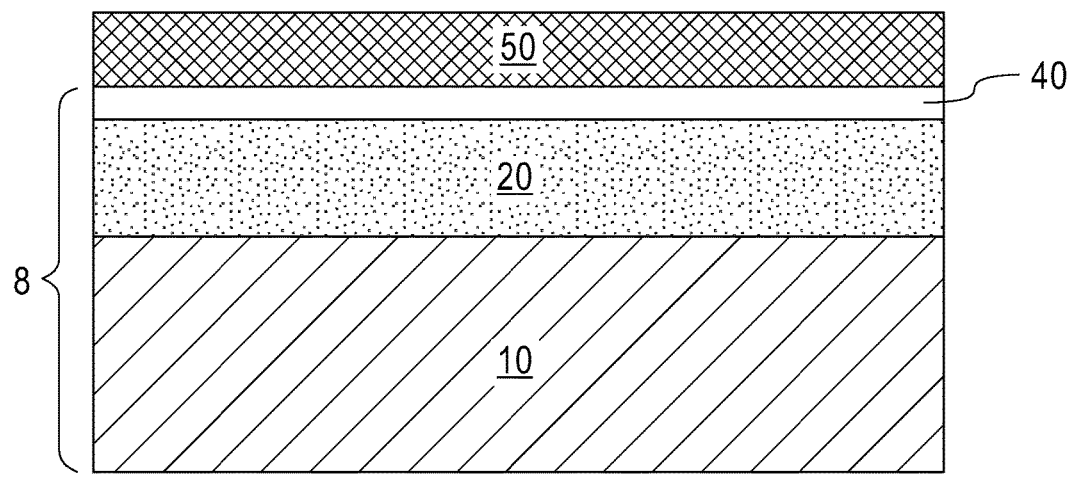
FIG. 5 is a cross-sectional view of the exemplary semiconductor structure of FIG. 4 after forming a blanket SiGe layer over the thinned Si layer.

Referring to FIG. 5, a SiGe layer 50 is epitaxially grown on the thinned Si layer 40 using a blanket layer deposition process. "Blanket" deposition refers to the deposition of the layer without masking either of the portions of the substrate later used for nFET and pFET formation. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. The SiGe layer 50 formed thus has the same crystalline characteristics as that of the underlying thinned Si layer 40.

The SiGe epitaxy deposition can be performed using any conventional epitaxial growth method capable of growing SiGe that is metastable and substantially free from defects. For example, the SiGe layer 50 can be formed by CVD or molecular beam epitaxy (MBE) at a temperature ranging from 600° C. to 850° C. Exemplary gases that can be employed as a source of Si include, but are not limited to, silane ($SiH_4$), dichlorosilane ($SiH_2Cl_2$), and silicone tetrachloride ($SiCl_4$). Exemplary gases that can be employed used as a source of Ge include, but are not limited to, germane ($GeH_4$) and germane tetrachloride ($GeCl_4$).

The germanium content of the SiGe layer 50 may range from 20% to 40%, by atomic weight %, although lesser and greater germanium contents can also be employed. In one embodiment, the SiGe layer 50 contains 35% of Ge. The thickness of the SiGe layer 50 can be form 20 nm to 100 nm, although lesser and greater thicknesses can also be employed.

Figure 6:
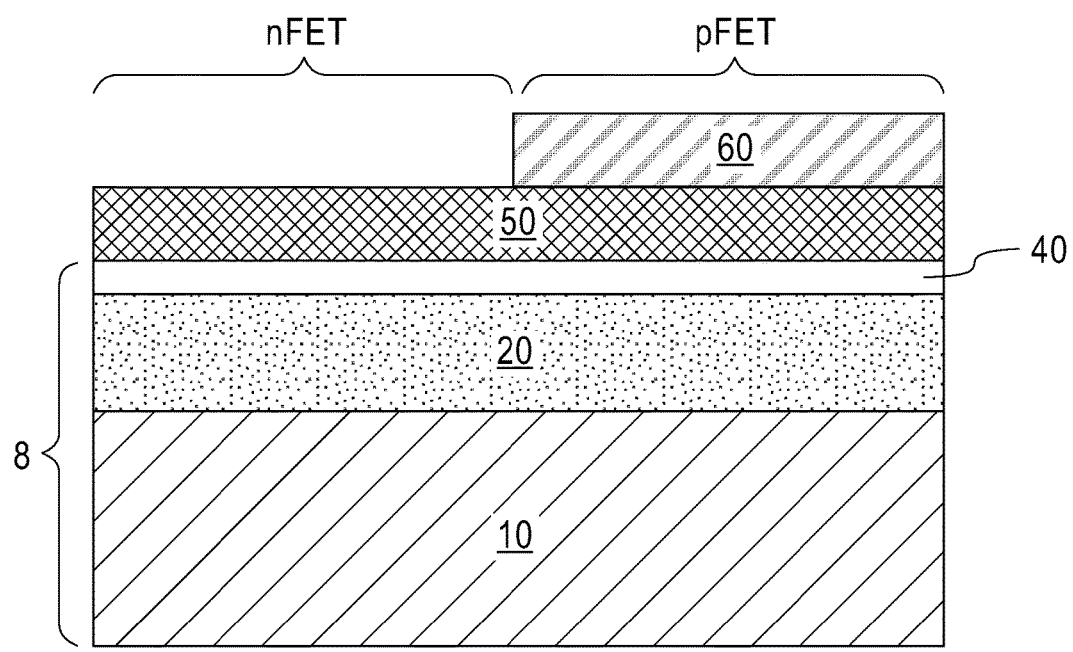
FIG. 6 is a cross-sectional view of the exemplary semiconductor structure of FIG. 5 after masking a pFET region of the SOI substrate with a mask layer portion.

Referring to FIG. 6, a mask layer portion 60 is formed covering a portion of the SiGe layer 50 that is located in a pFET region of the SOI substrate 8, leaving a portion of the SiGe layer 50 that is located in an nFET region of the SOI substrate 8 exposed. The mask layer portion 60 can be formed by applying a mask layer (not shown) over the entire top surface of the SiGe layer 50 and lithographically patterning the mask layer. The mask layer may be a photoresist layer or a photoresist layer in conjunction with hard mask layer(s). The remaining portion of the mask layer constitutes the mask layer portion 60.

Figure 7:
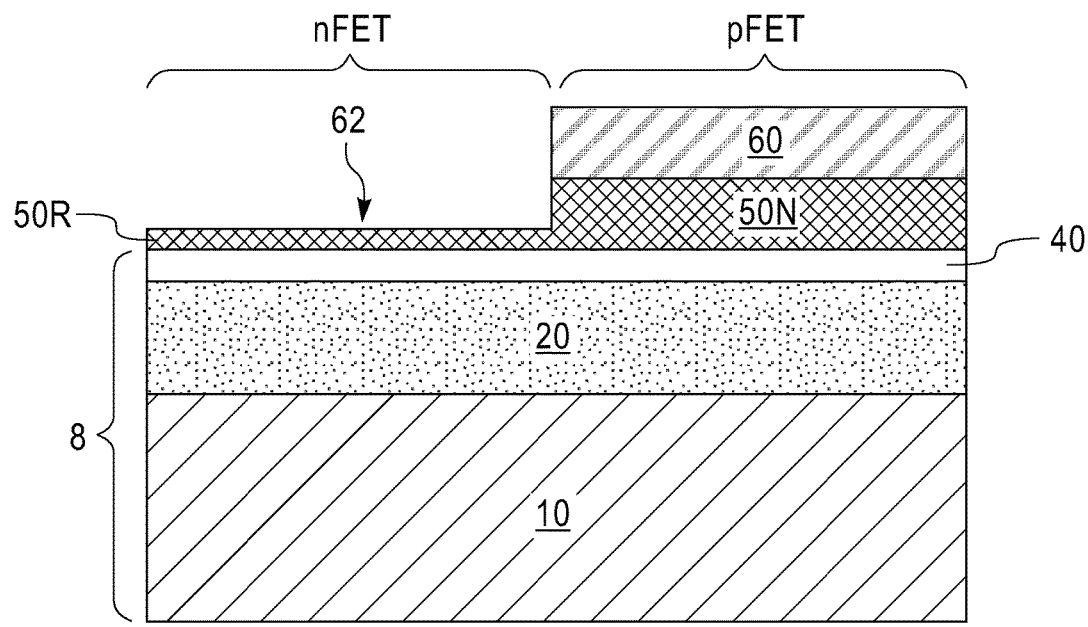
FIG. 7 is a cross-sectional view of the exemplary semiconductor structure of FIG. 6 after recessing a portion of the SiGe layer located in an nFET region of the SOI substrate that is not covered by the mask layer portion.

Referring to FIG. 7, the physically exposed portion of the SiGe layer 50 is recessed to provide a trench 62 therein. The trench 62 extends partially into the SiGe layer 50, and as a result of the recess, a recessed portion of the SiGe layer, indicated as 50R, remains in the nFET region, while a non-recess portion of the SiGe layer, indicated as 50N, remains in the pFET region. The recess of the exposed portion of the SiGe layer 50 can be performed by an anisotropic etch that selectively removes the exposed portion of the SiGe layer 50, without removing the mask layer portion 60. In one embodiment, the SiGe layer 50 is recessed using a timed anisotropic etch, for example, a timed RIE such that after recess, a thin layer of SiGe (i.e., the recessed portion of the SiGe layer 50R) remains above the thinned Si layer 40 in the nFET region. The recessed portion of the SiGe layer 50R may have a thickness ranging from 2 nm to 10 nm, although lesser and greater thicknesses can also be employed. The recessed portion of the SiGe layer 50R protects the surface of the thinned Si layer 40 during the RIE process.

Figure 8:
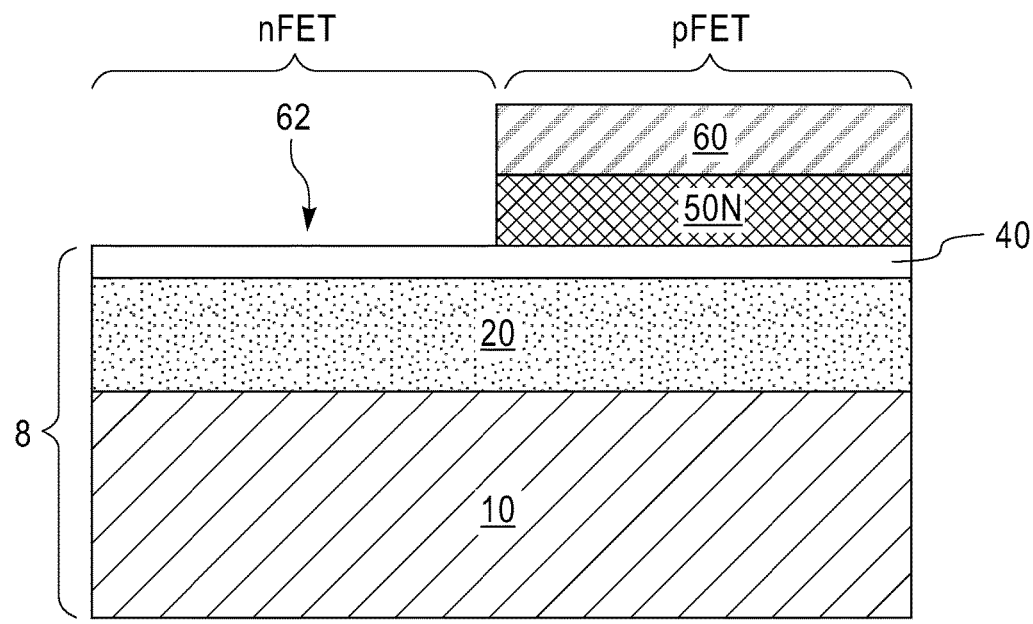
FIG. 8 is a cross-sectional view of the exemplary semiconductor structure of FIG. 7 after removing a recessed portion of the SiGe layer from the nFET region.

Referring to FIG. 8, a SiGe removal which includes an in-situ pre-clean etch is performed to remove the recessed portion of the SiGe layer 50R from the nFET region. The portion of the thinned Si layer 40 previously covered by the recessed portion of the SiGe layer 50R in the nFET region is thus exposed. The in-situ SiGe removal etch also removes native oxide and organic contaminants with the SiGe in the recessed portion of the SiGe layer 50R. and exposes a pristine Si surface in the thinned Si layer 40. The in-situ pre-clean etch may be a dry etch using hydrogen chloride (HCl) as the etching gas. The temperature for the in-situ pre-clean etch may range from 550° C. to 650° C. The surface of the portion of the thinned Si layer 40 in the nFET region thus is free of native oxide and is ready for the subsequent Si epitaxy re-growth. Because the etch chemistry employed in the in-situ pre-clean process has a high etch selectivity between SiGe and Si, the thickness uniformity of the thinned Si layer 40 is maintained in the nFET region. The relatively low temperature employed in the in-situ pre-clean etch also eliminates the corner rounding encountered in the prior art method. All these ensure the formation of an epitaxial Si layer with reduced defects. Moreover, in the present application the etch conditions are selected such that the SiGe removal and pre-clean etch does not affect the meta-stable state of the non-recessed portion of the SiGe layer 50N that remains in the pFET region, the defect level in the non-recessed portion of the SiGe layer 50N thus remains low.

Figure 9:
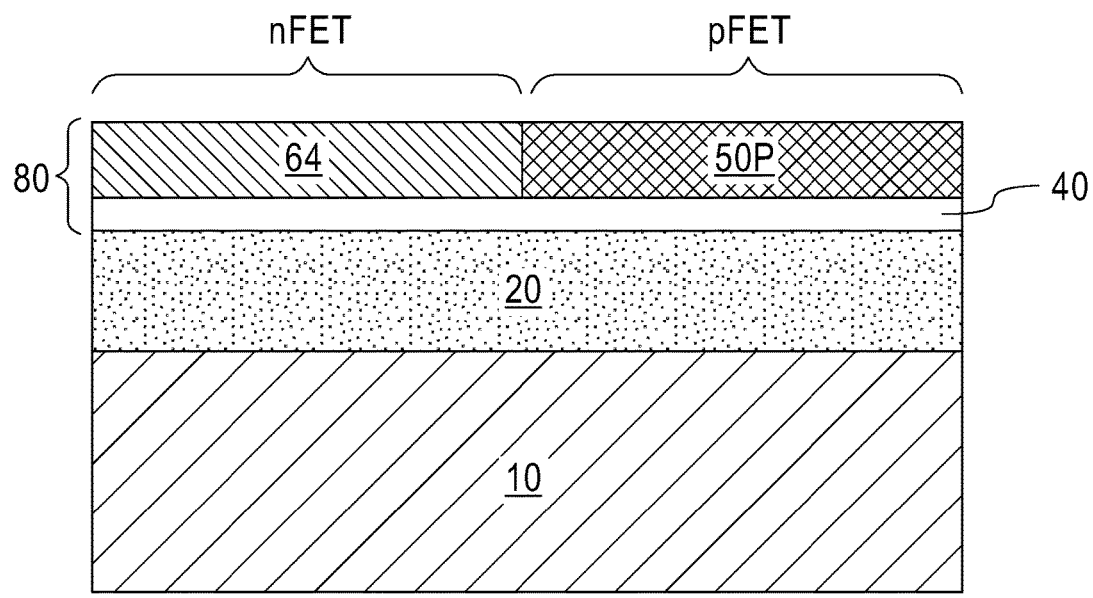
FIG. 9 is a cross-sectional view of the exemplary semiconductor structure of FIG. 8 after forming an epitaxial Si layer over a portion of the thinned Si layer exposed by the removal of the recessed portion of the SiGe layer.

Referring to FIG. 9, an epitaxial Si layer 64 is re-grown over the exposed portion of the thinned Si layer 40 in the nFET region such that the epitaxial Si layer 64 has the same crystalline characteristics as that of the thinned Si layer 40. The epitaxial Si layer 64 may be formed by selective epitaxy in which Si is formed only on the semiconductor surfaces (e.g., the surfaces of the thinned Si layer 40 and the non-recessed portion of the SiGe layer 50N, but not on the dielectric surface (e.g., the surface of the mask layer portion 60). In one embodiment, the epitaxial Si layer 64 can be formed, for example, by CVD at a temperature ranging from 600° C. to 850° C. The epitaxial Si layer 64 may grow exceeding the level of the non-recessed portion of the SiGe layer 50N. The epitaxial Si layer 64 may be subsequently recessed, for example, by CMP such that a top surface of the epitaxial Si layer 64 is coplanar with the top surface of the non-recessed portion of the SiGe layer 50N. After formation of the epitaxial silicon layer 64, the mask layer portion 60 may be removed by oxygen-based plasma etching.

Figure 10:
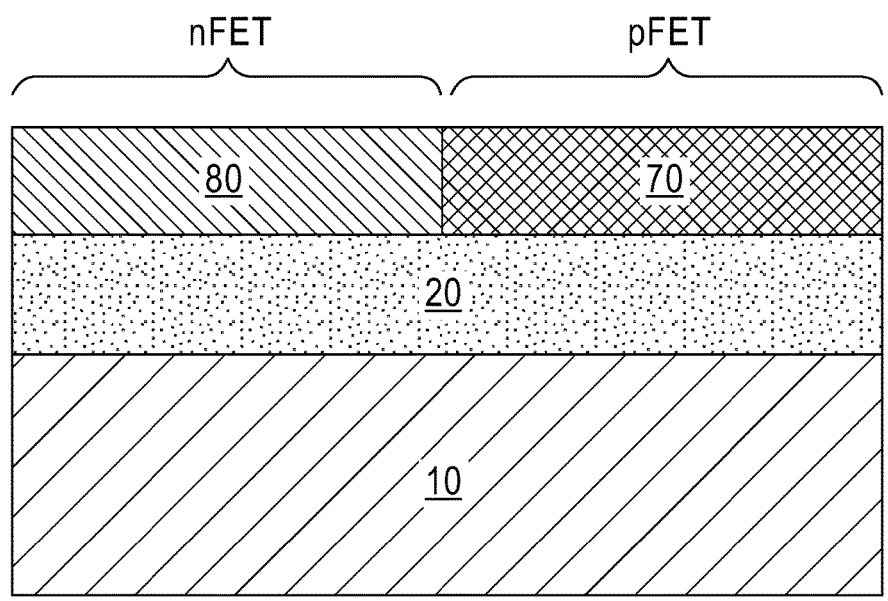
FIG. 10 is a cross-sectional view of the exemplary semiconductor structure of FIG. 9 after forming a SiGe channel layer in the pFET region.

Referring to FIG. 10, the non-recessed portion of the SiGe layer 50N and the underlying portion of the thinned Si layer 40 in the pFET region are converted to a SiGe channel layer 70. In one embodiment, a thermal mixing process is used in which the structure of FIG. 8 is annealed in an inert ambient at a temperature (and duration) that allows for interdiffusion of Ge in the non-recessed portion of the SiGe layer 50N throughout the underlying portion of the thinned Si layer 40. The anneal may be performed at a temperature ranging from 600° C. to 1300° C. for a duration ranging from 10 seconds to 20 minutes.

After anneal, the epitaxial Si layer 64 and a portion of the thinned Si layer 40 underlying the epitaxial Si layer 64 together define a Si channel layer 80 in the nFET region.

Figure 11:
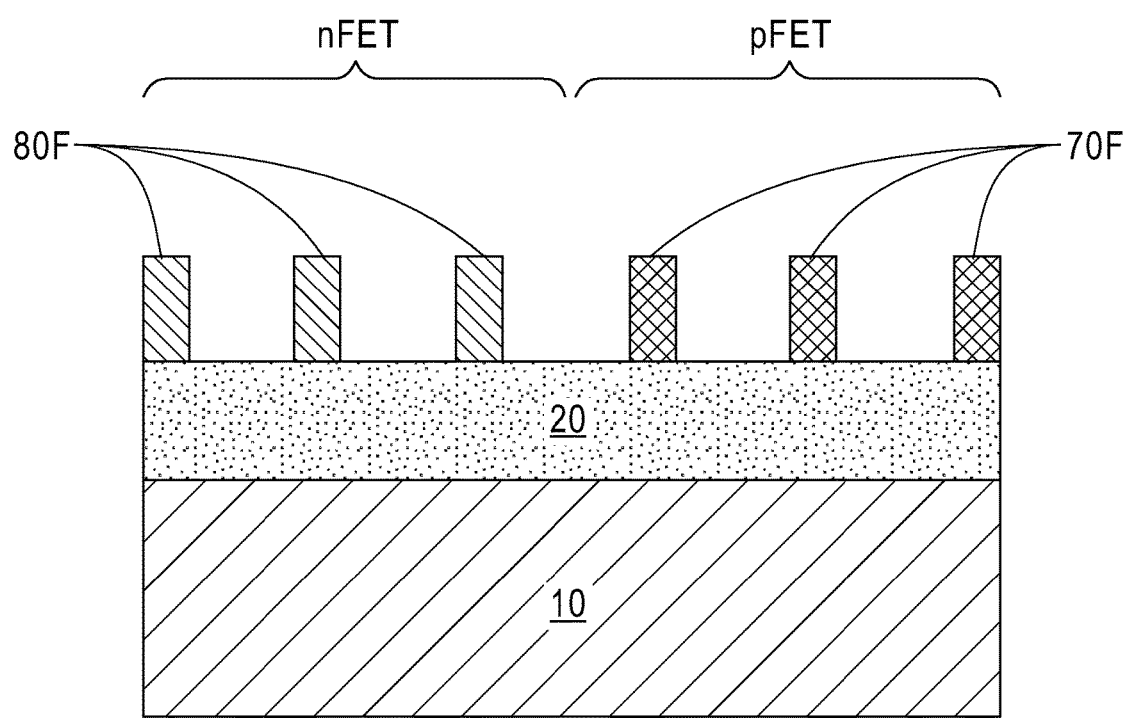
FIG. 11 is a cross-sectional view of the exemplary semiconductor structure of FIG. 10 after forming first semiconductor fins in the pFET region and second semiconductor fins in the nFET region.

Referring to FIG. 11, a set of first semiconductor fins 70F is formed in the pFET region, while a set of second semiconductor fins 80F is formed in the nFET region. The first semiconductor fins 70F are comprised of SiGe, while the second semiconductor fins 80F are comprised of Si. The first and the second semiconductor fins 70F, 80F can be formed by lithography and etching. The lithographic step includes applying a photoresist layer (not shown) over the top surfaces of the SiGe channel layer 70 and the Si channel layer 80, exposing the photoresist layer to a desired pattern of radiation, and developing the exposed photoresist layer utilizing a conventional resist developer. The etching process may be a dry etch and/or a wet chemical etch. In one embodiment, a RIE process is used. The etching process transfers the pattern from the patterned photoresist layer to the SiGe channel layer 70 and the Si channel 80 to provide the first and the second semiconductor fins 70F, 80F utilizing the buried insulator layer 20 as an etch stop. After forming the first and the second semiconductor fins 70F, 80F, the patterned photoresist layer can be removed utilizing a conventional resist stripping process such as, for example, ashing. Alternatively, the first and the second semiconductor fins 70F, 80F can also be formed utilizing a sidewall image transfer (SIT) process. In a typical SIT process, spacers are formed on sacrificial mandrels. The sacrificial mandrels are removed and the remaining spacers are used as an etch mask to etch the top semiconductor layer. The spacers are then removed after the first and the second semiconductor fins 70F, 80F have been formed.

Subsequently, conventional CMOS processing is employed to form pFETs in the pFET region and nFETs in the nFET region. A first gate structure (not shown) can be formed over a portion of each first semiconductor fin 70F to provide FinFETs in the pFET region, while a second gate structure (not shown) can be formed over a portion of each second semiconductor fin 80F to provide FinFETs in the nFET region. The gate structures can be formed utilizing a gate first or a gate last process known in the art. Each gate structure may include a gate dielectric and a gate conductor.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming a silicon germanium layer over a thinned silicon layer located over a substrate;
    recessing a portion of the silicon germanium layer located in a first device region of the substrate, while masking another portion of the silicon germanium layer located in a second device region of the substrate, to provide a recessed portion of the silicon germanium layer in the first device region and a non-recessed portion of the silicon germanium layer in the second device region laterally abutting the recessed portion, wherein a top surface of the recessed portion of the silicon germanium layer is located below a top surface of the non-recessed portion of the silicon germanium layer;

removing the recessed portion of the silicon germanium layer to expose a portion of the thinned silicon layer in the first device region; and epitaxially growing silicon from a top surface of the exposed portion of the thinned silicon layer and a sidewall surface of the another portion of the silicon germanium layer located in the second device region to form an epitaxial silicon layer over the exposed portion of the thinned silicon layer in the first device region.

2. The method of claim 1, wherein the first device region is an n-type field effect transistor region, and the second device region is a p-type field effect transistor region.

3. The method of claim 1, wherein the silicon germanium layer is formed across an entire top surface of the thinned silicon layer.

4. The method of claim 1, wherein the silicon germanium layer is formed by chemical vapor deposition (CVD) or molecular beam epitaxy (MBE) at a temperature ranging from 600° C. to 850° C.

5. The method of claim 1, wherein a germanium content in the silicon germanium layer is from 20 atomic weight % to 40 atomic weight %.

6. The method of claim 1, wherein the thickness of the thinned silicon layer is no greater than 10 nm.

7. The method of claim 1, further comprising:
providing a silicon-on-insulator (SOI) substrate comprising, from bottom to top, a handle substrate, a buried insulator layer and a top silicon layer; and
thinning the top silicon layer to provide the thinned silicon layer, wherein the thinning the top silicon layer comprises:
oxidizing a portion of the top silicon layer to form an oxidized portion,
removing the oxidized portion, and
repeating the oxidizing and the removing until a desired thickness of the thinned silicon layer is obtained.

8. The method of claim 7, wherein the oxidation of the portion of the top silicon layer is performed by a thermal oxidation.

9. The method of claim 7, wherein the oxidized portion of the top silicon layer is removed by hydrofluoric acid.

10. The method of claim 1, wherein the portion of the silicon germanium layer located in the first device region is recessed by a timed reactive ion etch (RIE) process.

11. The method of claim 1, wherein the recessed portion of the silicon germanium layer is removed by an in-situ pre-clean etch.

12. The method of claim 11, wherein the in-situ pre-clean etch comprises a dry etch using a hydrogen chloride gas.

13. The method of claim 12, wherein the in-situ pre-clean etch is carried out at a temperature ranging from 550° C. to 650° C.

14. The method of claim 1, wherein a thickness of the recessed portion of the silicon germanium layer is from 2 nm to 10 nm.

15. The method of claim 1, further comprising forming a mask layer portion covering the another portion of the silicon germanium layer, wherein the forming the mask layer portion comprises:
forming a mask layer over the silicon germanium layer; and
patterning the mask layer to provide the mask layer portion.

16. The method of claim 15, further comprising removing the mask layer portion after the depositing the epitaxial silicon layer.

17. The method of claim 1, wherein the epitaxial silicon layer is deposited by a selective epitaxy growth process, wherein the epitaxial silicon layer and the underlying portion of the thinned silicon layer constitute a silicon channel layer in the first device region.

18. The method of claim 17, further comprising converting the another portion of the silicon germanium layer located in the second device region and a portion of the thinned silicon layer underlying the another portion of the silicon germanium layer into a silicon germanium channel layer after forming the epitaxial silicon layer.

19. The method of claim 18, wherein the another portion of the silicon germanium layer and the portion of the thinned silicon layer underlying the another portion of the silicon germanium layer is converted by thermal mixing.

20. The method of claim 18, further comprising forming a plurality of first semiconductor fins from the silicon germanium channel layer and a plurality of second semiconductor fins from the silicon channel layer.

* * * * *